United States Patent
Bonucci et al.

(10) Patent No.: US 10,053,604 B2
(45) Date of Patent: Aug. 21, 2018

(54) COMPOSITE MATERIAL FOR THE PROTECTION OF H₂O SENSITIVE DEVICES BASED ON SURFACE FUNCTIONALIZED NANOZEOLITES DISPERSED IN A POLYMERIC MATRIX

(71) Applicant: SAES GETTERS S.P.A., Lainate (IT)

(72) Inventors: Antonio Bonucci, Milan (IT); Roberto Macchi, Solbiate Olona (IT); Roberto Giannantonio, Oleggio (IT)

(73) Assignee: SAES GETTERS S.P.A., Lainate (IT)

( * ) Notice: Subject to any disclaimer, the term of this patent is extended or adjusted under 35 U.S.C. 154(b) by 87 days.

(21) Appl. No.: 15/376,472

(22) Filed: Dec. 12, 2016

(65) Prior Publication Data

US 2017/0152416 A1    Jun. 1, 2017

Related U.S. Application Data

(62) Division of application No. 13/131,393, filed as application No. PCT/EP2009/066445 on Dec. 4, 2009, now abandoned.

(30) Foreign Application Priority Data

Dec. 12, 2008    (IT) .............................. MI2008A2206

(51) Int. Cl.
| | | |
|---|---|---|
| *C09J 163/00* | (2006.01) | |
| *H01L 51/44* | (2006.01) | |
| *H01G 9/20* | (2006.01) | |
| *B81B 7/00* | (2006.01) | |
| *H01L 31/048* | (2014.01) | |
| *H01L 33/56* | (2010.01) | |
| *H01L 51/52* | (2006.01) | |

(Continued)

(52) U.S. Cl.
CPC ........... *C09J 163/00* (2013.01); *B81B 7/0038* (2013.01); *C09J 11/04* (2013.01); *H01G 9/2077* (2013.01); *H01L 31/048* (2013.01); *H01L 33/56* (2013.01); *H01L 51/0034* (2013.01); *H01L 51/448* (2013.01); *H01L 51/5253* (2013.01); *H01M 10/052* (2013.01)

(58) Field of Classification Search
CPC ................................................ H01L 51/5259
See application file for complete search history.

(56) References Cited

U.S. PATENT DOCUMENTS

| | | | |
|---|---|---|---|
| 2003/0143423 A1* | 7/2003 | McCormick ........ | H01L 51/5237 428/690 |
| 2004/0225025 A1* | 11/2004 | Sullivan ................. | C08G 59/62 522/71 |

(Continued)

FOREIGN PATENT DOCUMENTS

| | | | | |
|---|---|---|---|---|
| JP | 2003155355 A | 5/2003 | | |
| WO | WO 2007074494 A1 * | 7/2007 | ............... | C08K 9/04 |

*Primary Examiner* — Ian A Rummel
(74) *Attorney, Agent, or Firm* — Steinfl + Bruno, LLP

(57) ABSTRACT

A sensitive device is described including an edge of the sensitive device and a composite material sealing the edge of the sensitive device. The composite material includes a homogeneous dispersion of superficially functionalized nanozeolites in a polymerizable compound. The nanozeolites contain surface modifying organic groups belonging to the same chemical class of at least one functional group of the polymerizable compound.

13 Claims, 1 Drawing Sheet

(51) Int. Cl.
*C09J 11/04* (2006.01)
*H01L 51/00* (2006.01)
*H01M 10/052* (2010.01)

(56) References Cited

U.S. PATENT DOCUMENTS

2006/0284556 A1* 12/2006 Tremel .................. H05B 33/04
313/512
2010/0168279 A1* 7/2010 Kong ................ C08G 59/5006
523/445

* cited by examiner

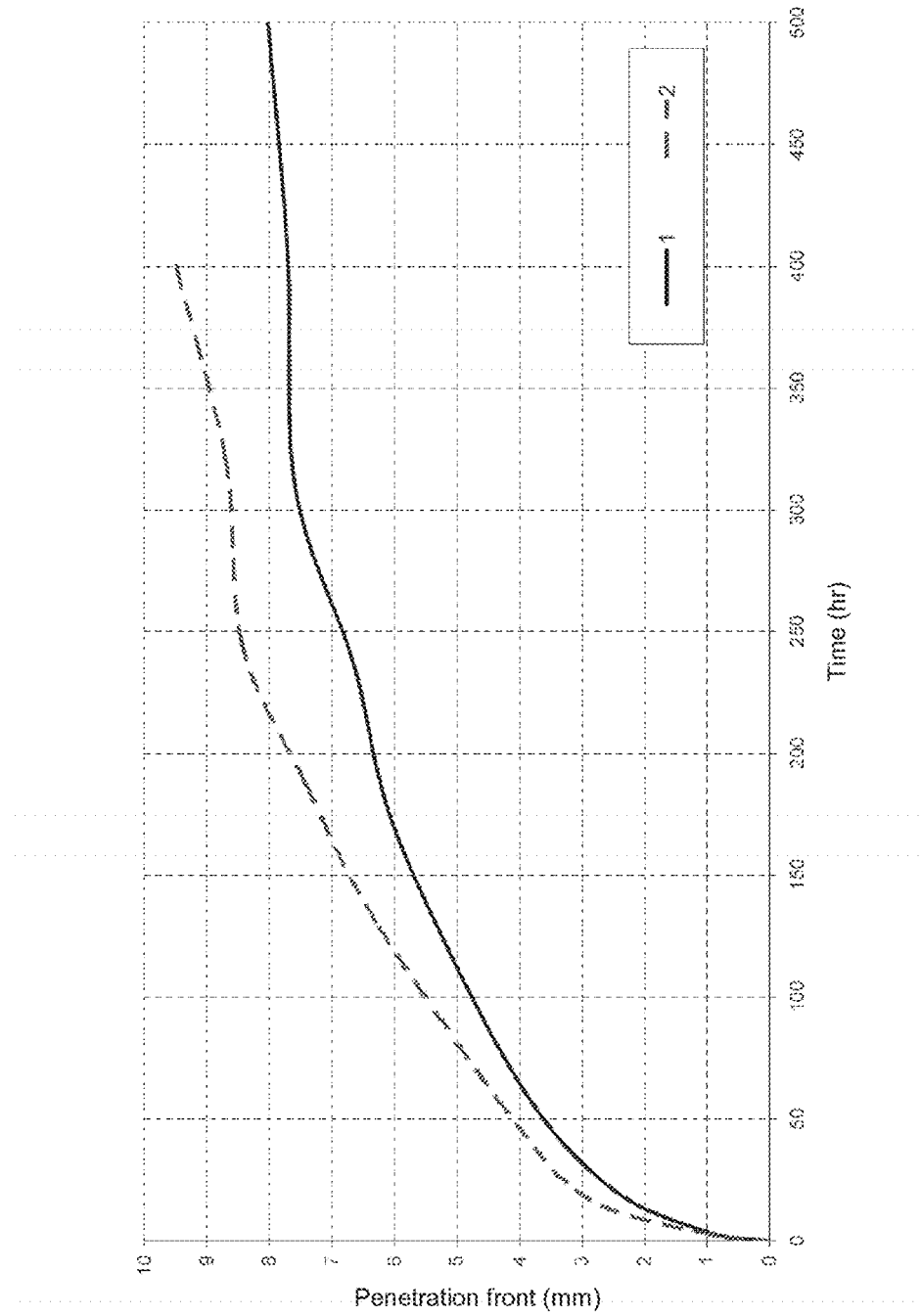

COMPOSITE MATERIAL FOR THE PROTECTION OF H₂O SENSITIVE DEVICES BASED ON SURFACE FUNCTIONALIZED NANOZEOLITES DISPERSED IN A POLYMERIC MATRIX

CROSS REFERENCE TO RELATED APPLICATIONS

The present application is a divisional application of U.S. application Ser. No. 13/131,393 filed on Aug. 17, 2011 which is the U.S. national stage of International Application PCT/EP2009/066445 filed on Dec. 4, 2009 which, in turn, claims priority to Italian Application No. MI2008A002206, filed on Dec. 12, 2008.

BACKGROUND OF THE INVENTION

The present invention relates to a composite material for the protection of sensitive devices to the permeation of $H_2O$ from the external environment, the composite material being formed of nanozeolites dispersed in a polymeric matrix.

It is known that the presence of $H_2O$, even in the form of traces, is harmful for the correct operation of several devices, among which there are micro-electromechanical devices known in the field as MEMS (Micro-Electro-Mechanical Systems), OLED type organic displays (Organic Light Emitting Diode) and photovoltaic cells such as OSC (Organic Solar Cells) or DSSC (Dye-Sensitized Solar Cells), to mention some of the most interesting ones. In the following, reference will be made to these devices and more generally to any sealed device wherein the presence of $H_2O$, even in small amounts (lower than 5000 ppm), results to be harmful, with the wording "sensitive device".

The presence of $H_2O$ in sensitive devices may cause the progressive deterioration of their performances. More information as to the effects of this contaminant may be found in the scientific paper "Correlation between dark spot growth and pinhole size in organic light-emitting diodes", by Shuang Fang Lim, et al., published on Applied Physics Letters, Vol. 78 No. 15, on 9 Apr. 2001 concerning OLED displays, and in the fifth chapter of the book "Organic Photovoltaics-Concepts and Realization" by Brabec et al., published in 2003 by Springer-Verlag, concerning OSC type photovoltaic cells.

The use of sorbents for the removal of gaseous impurities from the housings of devices sensitive to their presence is known in the art. For example, the international patent publication WO 2004/072604 in the applicant's name discloses the use of active components dispersed in suitable porous matrices; on the other hand international patent publications WO 2007/013118 and WO 2007/013119, both in the applicant's name, disclose nanostructured systems in which the active component is restricted in a porous means that are dispersed in a polymeric matrix, while the use of functionalized nuclei dispersed in a permeable polymeric matrix is disclosed in the international publication WO 2007/074494, also in the applicant's name.

However, the use of the above-described solutions may be not sufficient to extend the life of the sensitive device up to a length of time compatible with its application field, especially when the permeation flux of $H_2O$ is at a higher speed than the gettering flux specified by the sorbing properties of the composite getter. The permeation speed from the external environment in fact depends on how the device is sealed during the manufacturing step, i.e. on the chemical-physical characteristics of the material used for such a sealing.

During the whole life of the device, the sealing material must be able to act as a barrier in order to protect the packaged device from possible contaminants coming from the outside environment. If the permeation of these contaminants through the sealant is such to lead to the saturation of the getter material inserted in the device after a time that is too short or, anyway, not compatible with the intended application of the device, its protection from possible deterioration processes is not ensured: the barrier shall possess suitable characteristics in term of water permeation in order to guarantee an acceptable lifetime and the presence of the getter material in the sensitive device may have a synergistic effect with the barrier, avoiding its premature saturation. Alternatively, the protection can not be ensured when the effective permeation speed into the device is higher than the sorbing speed of the getter material. Even when the getter material is not inactive due to the saturation if the contaminant is captured with a sorption speed lower than the permeation speed, the damage of the sensitive device element can not be avoided.

In the manufacturing processes of sensitive devices, the use of different polymeric materials to ensure sealing and the protection of the devices from the outer environment, due to their low permeability to the different species of contaminants, is known in the art. For example, the international publication WO 2003/011939 in the name of 3M Innovative Properties Co. discloses that epoxy resins and organic compounds comprising hydroxylic groups can be used as a base for chemical compositions that after a consolidation treatment allow to obtain surface adhesion and low coefficients of moisture transmission rate (commonly referred to as WVTR-Water Vapor Transmission Rate).

Among the suitable additives in these compositions, the use of inert inorganic materials is foreseen in order to reduce the permeation of $H_2O$ in the enclosed environment of the device. However, the use of inert materials limits the barrier properties essentially to those of the final polymeric matrix, and the publication does not tackle the technical problem of achieving a homogeneous dispersion of these inorganic materials associated with the preparation of the composition Other drawbacks in the case of barriers consisting of a polymeric matrix containing sorbing species featuring a micrometric particle size are given by the difficulties of obtaining sufficiently homogeneous deposits during the manufacturing step of the device especially if thicknesses have to be of about 15 μm or lower. This is coupled with additional difficulties of ensuring a sufficient adhesion to the involved surfaces of the device or of the encapsulant structure after the consolidation process. Moreover, when sealing materials contain sorbing species featuring a nanometric particle size (nanozeolites in particular) the limits are more commonly represented by the difficulty of ensuring a homogeneous dispersion of these sorbing species inside the polymeric matrix due to their tendency to agglomerate caused by their large surface area. The difficulty to control the agglomeration phenomena could cause difficulties to obtain reproducible final properties of the consolidated material and therefore to properly use it in industrial manufacturing processes.

A possible solution for the these composite materials is disclosed in the international publication WO 2008/057045 in the name of Agency For Science Technology And Research, which describes the use of reactive nanoparticles able to sorb water and oxygen molecules inside an epoxy-based composition. However, this document teaches the use of this composition within a multilayer structure able to obtain low permeation values from the outside of the sensitive device. In fact, it is well known in the encapsulation technical field of sensitive devices that better barrier properties are obtained when using one or more sorbing layers (based on a polymeric-getter composite materials or only on getter materials) externally coupled with a so-called (strictly speaking) "sealing layer", i.e. based on a low permeable material but not containing a reactive species. Anyway, these multilayer structure usually need a manufacturing process that is more complex than using a single-layer barrier.

The article "Characterization and preparation of epoxy resin/zeolite nanocomposite" by Chen et al, edited on Diqiu Kexue vol. 27, pp. 403-407 in 2002 teaches on the use of surfactants or templating agents in order to overcome the difficulties to obtain an homogeneous dispersion of nanoparticles in a polymeric matrix. Similarly, other scientific articles, as for example "Preparation and Characterization of epoxy composites filled with functionalized nano-sized MCM-41 particles" by Wang et al., edited on Journal of Material Sciences, vol. 43, pp. 3683-3688, on 4 Apr. 2008, have studied the effect of inorganic functionalizations or templating agents to improve the interaction between the inorganic particles and the polymeric matrix. All these publications describe different approaches to improve the control on the interaction of the inorganic surface with the organic phase.

As described in the International Patent Application published as WO 2008/000457, the above mentioned nanozeolites can be coated on their surface, where the chemical surface modification is characterized by hydrophobic organic groups bonded by covalent bonds to the zeolite surface. This publication describes some possible applications (related to the uniformity of the nanozeolites in the organic material) for the final composite material that contains them. In particular such reference addresses the problem of the uniformity of the distribution but is completely silent on the effect of the functionalization on the absorption properties of the zeolites and on the quantitative evaluation of its effect on the barrier properties of the sealing material.

BRIEF SUMMARY OF THE INVENTION

It is an object of the present invention to overcome the limits still present in the art concerning the use of sealing materials for devices sensitive to $H_2O$, by ensuring a homogeneous dispersion of the sorbing species inside a polymeric matrix and, at the same time, by maximizing their barrier properties to avoid as much as possible contaminations from the external environment to packaged elements of a sensitive device. Even if the state of the art shows how the mechanical and/or optical properties of the nanocomposite can be increased, there is no mention of how to improve the barrier properties with reference to beneficial effects given by the introduction of selected ionic species, block-copolymers or surface functionalization, as well as on the preferred chemical compositions of barriers to protect sensitive devices.

In a first aspect thereof the invention is inherent to a barrier composite material against the ingress of $H_2O$ comprising a homogeneous dispersion of superficially functionalized nanozeolites in polymerizable compounds or in a solvent containing them, characterized in that said nanozeolites contain a surface modifying organic group belonging to the same chemical class of at least one functional group of the polymerizable compound. In the description of the present invention a polymerizable compound is defined as an organic composition (that is non or only partially polymerized) where a polymerization process is employed to give a more cross-linked structure by a suitable curing treatment.

BRIEF DESCRIPTION OF THE DRAWING

The accompanying drawing, which is incorporated into and constitutes a part of this specification, illustrates one or more embodiments of the present disclosure and, together with the description of the example embodiments, serves to explain the principles and implementations of the disclosure.

FIG. 1 shows a comparison of the barrier properties between composite material of the present invention and prior art.

DETAILED DESCRIPTION OF THE INVENTION

The invention will be further described by means of FIG. 1, showing a comparison of the barrier properties between a composite material according to the present invention and a composite material of the prior art.

In fact, when the use of nanozeolites as reactive species is foreseen, a suitable solution to the above-described problem of achieving a homogeneous dispersion is to functionalize their surface with organic groups in order to reduce their tendency to aggregate and to obtain an unexpected improvement of the barrier properties of the final composite material with respect to a composite material containing non-functionalized or not-suitably functionalized nanozeolites.

Organic functional groups that can be covalently bonded on the surface of the nanozeolites or connected (still by a covalent bond) to the main chain of a polymerizable material can be classified basing on its chemical class: for example, in the following description of the invention, this classification will considered aliphatic groups such as alkyl-, alkenyl- (e.g. vinyl-) or alkynyl-, aromatic groups as phenyl- or benzyl-. Moreover, functional groups can be classified as amino-, imino-, acrylic- and methacryl-, epoxidic-, isocianate- etc. groups.

The inventors have found out that, once the polymerizable composition of the preferred sealing resin has been chosen, only some types of functionalization of the nanozeolites can ensure, subsequent to the consolidation step, levels of $H_2O$ penetration that are compatible with the maintenance of inner concentrations of the gaseous species lower than the critical value for time comparable to the desired life of the sensitive device. Thus special chemical formulations have been found, which comprise precursors of polymeric matrices and also nanometric zeolites superficially functionalized that are to be considered particularly advantageous.

With regard to the characteristic of the polymeric compounds to be used as barrier composite material according to the present invention, the preferred ones exhibit a permeability lower than 10 g mm m$^{-2}$ day$^{-1}$ at 25° C. and 60% relative humidity. Concerning the formulation of the dispensable material of the present invention, epoxy resins are particularly suitable as precursors of the polymeric matrix, with particular reference to single component formulations, acrylic (to obtain, for example, polymethylmethacrylate PMMA), urethane (polyurethane PU), olefins (polyethylene PE or HDPE, polypropylene PP, Ethylene propylene rubber EPR) and styrene (polystyrene PS) polymers, as well as isobutylene/isoprene based copolymers (known as butyl rubbers BR). Among epoxy resins, Bisphenol A and epichlorhydrin based resins, known under the acronym DGEBA (Diglycidyl Ether of Bisphenol A), novolak resins and cycloaliphatic resins are particularly advantageous.

Concerning nanometric zeolites that have proved to be suitable to be used as reactive species to be inserted into the polymeric matrix there are surface modified Linde Type A (LTA), Linde Type L (LTL), Faujasite (FAU), Mordenite (MOR) or Gismondine (GIS) zeolites.

With regard to the specific type of their functionalization, the inventors have found that better results can be obtained with particular reference to aromatic groups such as phenyl groups (POD) or pentafluorphenyl groups (PFOD), or organic groups such as vinyl groups (VN), allyl groups (ALL), amino groups (AMP), glycidoxy groups (GTO) methacrilic groups (MCR) or other aliphatic groups (as for example iso-butyl groups OD).

Possible suitable additives present inside the dispensable composition are cationic photoinitiators, plasticizing additives, additives providing flexibility, reactive diluents, consolidating/cross-linking agents and adhesion promoters.

The inventors have found out that barrier properties depend on the composition containing a dispensable material and nanozeolites and mainly can be distinguished in different cases according to different surface functionalization of the nanozeolites:
   a. not organically functionalized;
   b. functionalized by organic groups belonging to different chemical classes with respect to those which are contained in the polymerizable compound;
   c. functionalized by organic groups belonging to the same chemical class but not identical to those which are contained in the polymerizable compound; or
   d. functionalized by organic groups belonging to the same chemical class and identical to at least one of those which are contained in the polymerizable compound.

Moreover, in the case d), the identical organic groups present on the surface of the nanozeolites and in the polymerizable compound may be polymerizable groups or not.

The relationship between the particular case among the above reported ones and the barrier properties can be evaluated considering different parameters, as for example the lag time or the breakthrough time. These physical properties are described and studied in the article "Reactive barrier membranes: some theoretical observations regarding the time lag and breakthrough curves" by A. Siegel published on the Journal of Membrane Science, vol. 229 pp. 33-41 in the 2004. These properties can be also related to the effective sorption capacity of the nanozeolites in the polymeric matrix as an effect of the reduced amount of their sorption performance as compared to when they are in the powder form and not incorporated in a matrix.

The inventors have found that the use of functionalized nanozeolites can give better results with respect to both non surface-functionalized nanozeolites and to unloaded polymeric materials. By way of example, FIG. 1 shows a formulation that has been found particularly advantageous. This composition provides for the homogeneous dispersion of nanometric zeolites LTA 4A functionalized with aromatic groups POD within a DGEBA based epoxy resin that can be obtained through mechanical stirring. Nanozeolites were previously thermally activated. The obtained composite material has been compared to the case in which not-functionalized LTA 4A nanozeolites have been loaded in the same polymeric material.

The permeation front, a parameter which characterized the barrier properties of a given material, has been evaluated using a glass-to-glass configuration where the sealant composition was previously deposited to completely fill the space between the two glasses. This parameter is defined as the length of the barrier material deposit in glass-to-glass configuration corresponding to a specific critical $H_2O$ concentration, that can be different in relation to the final device of interest. Therefore it can be monitored with any analytical techniques able to measure the local amount of $H_2O$ in the polymeric material.

The performance as barrier material for different composite materials can be evaluated by comparing the different times after which the same penetration front has been observed: the relative time, referred to best performing material, have been reported. This parameter, in fact, is evaluated for a chosen $H_2O$ amount but it can be considered as a general property by the assumption that the penetration rate of water is constant in the material (i.e. does not change in function of the water concentration in the polymer).

Table 1 shows some experimental data obtained by comparing the behavior of different composite barriers in terms of the relative time to have the same penetration front. The nanozeolite dispersion in a polymeric matrix (evaluable as the standard deviation in the normal distribution that fits the size spectrum of the agglomerated dispersed phase) does not change meaningfully with their specific functionalization. This is not the case for the barrier properties, that are strongly affected by the specific nature of the functionalization group. Therefore the difference in the barrier performance is not related to the uniformity of the inorganic particle dispersion in the final matrix.

Using, for example, PMMA as polymeric material containing the same weight percent content of active species, not-functionalized nanozeolites (none case) or not-suitably functionalized (POD case) give the same effect on the barrier property of the final material whereas best results have been obtained with crosslinkable identical functional groups in the polymeric material and on the zeolite surface (MCR case). In particular in the reported example it can be observed that PMMA—OD or PMMA—MCR compositions, because of the longer time to have the same penetration front with respect to the PMMA—POD or PMMA—none, can not only protect a sensitive element for longer lasting time (from about 25 to 100%), but also can be used as protective coating or sealing perimetral deposits with reduced dimensions with respect to the comparative compositions, with obvious advantage in manufacturing and technological development.

In Table 2 other experimental data characterizing the barrier properties of composite materials have been reported, considering different concentration of active species and different kind of adhesive resin, as for example the acrylic resin (for example the Epotek og-603 sold by Epotek Technologies Inc.), a DGBEA-based epoxy glue (Epotek OG-142-17 by Epotek Technologies Inc.) or a cold-setting resin based on two fluid DGBEA-based epoxy components (Epofix by the Struers Inc.).

In a second aspect thereof the invention resides in a method for the use of the compositions of the invention during the encapsulating process of $H_2O$ sensitive devices, in order to protect them from the permeation of this contaminant by means of composite sorbers formed of nanozeolites superficially functionalized with organic groups inside a polymeric matrix.

The inventors have found out that deposition techniques particularly suitable for the compositions of the present invention are serigraphy (screen-printing), micro-dispensing (e.g. using a syringe), spin-coating, spray-coating, doctor blade technique, ink-jet, one-drop process. The deposition process may be so configured to result in a deposit along the edge only of the sensitive device or in an at least partial but preferably complete covering of the element or surface particularly sensible to the presence of moisture in the device.

The consolidation process is carried out after having suitably positioned the two surfaces desired to be coupled. Among the possible processes, UV radiation, thermal consolidation or a combination thereof have proved to be suitable for the present invention. As thermal consolidation, it can be also considered the room temperature curing of a bi-component mixture of precursor organic compounds or the solvent evaporation whenever the precursor is a solution containing the active species and the organic compounds.

In a third aspect the invention consists in a sensitive device wherein the barrier composition of the invention is used for its protection from external contamination, with main reference to moisture and oxygen.

Generally, the present invention is advantageous when it is necessary that the concentration of $H_2O$ inside the sensitive device does not exceed a critical value during the normal operation of the device. This critical value is related to the type of sensitive device, and among the devices requiring a very small water concentration there are the OLEDs, which typically require concentrations of 10 ppm or lower, whereas solar cells may withstand up to 5000 ppm before irreversible deterioration phenomena are generated. Photovoltaic cells (CIS-CIGS cells, CdTe cells, a-Si cells, OSC, DSSC), OLED displays, micro-electromechanical devices (MEMS or MOEMS), Light Emission Diodes (LED) and energy storage devices (with particular reference to lithium batteries and lithium air batteries) are among the sensitive devices that mostly benefit from the application of the method of the invention.

The composition of the invention, after its consolidation treatment, can act as the perimetric sealant material of the sensitive device, as perimetral barrier deposit coupled along an outer sealant material of the device or as a barrier layer coating the surface of the structural and/or functional elements of the device that are sensitive to the external environment contaminations. As a limit case, the barrier layer can be used as a filler material that completely fills the encapsulated volume in the sensitive device.

The invention will be further described with reference to the following examples.

Example 1

7.74 grams of LTA 4A-POD previously activated through a thermal process at 240° C. under vacuum have been added to 31.36 grams of an Epo-tek OG 142-17 resin (single component commercial epoxy resin based on epichlorhydrin and bisphenol A), viscosity 300-500 cPa s, Tg 54° C. The composition (DGBEAepoxy—POD) has been thus pre-dispersed by means of simple mechanical stirring and subsequently made homogeneous using a so called 3 roll mill mixer. All the operations previously described have been carried out inside a chamber under dry nitrogen atmosphere (generally referred to as "glove box").

A second composition (DGBEAepoxy—none) has been prepared similarly to the procedure above described, using 3.66 grams of non-organically functionalized LTA-4A and 14.50 grams of resin.

Glass-to-glass configurations (one for each composition) have been prepared under a moisture protected atmosphere by depositing 0.22 grams of dispensable material onto a surface of (2.54×6.00) $cm^2$ in order to achieve a thickness of 300 µm, followed by UV curing (300 sec, 100 mW/cm2, λ=250-400 nm).

The kinetic penetration level of $H_2O$ under an exposure condition of each sample at 85° C. and with 85% relative humidity is set forth in the graph of FIG. 1 in the form of a solid line 1 for the composition containing the surface modified zeolites and in the form of the broken line 2 for the non-functionalized case. In table 2 have been reported the relative times to have the same penetration front in the compared samples.

Example 2

230.8 grams of PMMA (Aldrich, MW 120000) were previously dissolved in 800 ml of Toluene anhydrous 99% (Aldrich). A clear viscous PMMA/Toluene suspension has been obtained under reflux heating at 80° C. for 30 minutes and mechanical stirring.

The composition PMMA—none prepared adding 1.90 grams of LTA 4A (previously activated 450° C. under vacuum) to 30.05 grams of PMMA/Toluene solution has been thus pre-dispersed by means of simple mechanical stirring and subsequently made homogeneous using a so-called 3 roll mill mixer. All the operations were carried out in glove box.

The glass to glass configurations were performed in glove box depositing the composite over a glass substrate 2.54× 6.00×0.015 cm, and gently heated to 50° C. for 10 minutes to consolidate the film, then a cover glass was applied and the glass to glass sample were dried under vacuum at 80° C. for 6 hours until constant weight of the system was achieved.

Similarly, surface modified nanozeolite containing compositions have been prepared using respectively:
a) PMMA—POD composition: 1.91 grams of LTA-4A POD (previously activated through a thermal process at 240° C.) in 31.32 grams of PMMA/Toluene solution;
b) PMMA—OD composition: 1.90 grams of LTA-4A OD previously activated through a thermal process at 170° C. in 31.50 grams of PMMA/Toluene solution; or
c) PMMA—MCR composition: 1.79 grams of LTA-4A MCR previously activated through a thermal process at 180° C. in 29.9 grams of PMMA/Toluene solution.

Glass-to-glass configurations using these compositions have been obtained following the same procedure described for the PMMA—none composition.

In Table 1 the relative times to have the same penetration front (testing conditions 85° C. and 85% relative humidity) in the compared samples have been reported.

Example 3

1.50 grams of LTA 4A-POD previously activated through a thermal process at 240° C. under vacuum have been added to 28.00 grams of an Epo-tek OG-603 resin (single component acrylic resin), viscosity 300-500 cPa s, Tg 54° C. The composition acrylic—POD has been thus pre-dispersed by means of simple mechanical stirring and subsequently made homogeneous using a so-called 3 roll mill mixer. All the operations previously described have been carried out inside a glove-box.

A second composition (acrylic—MCR) has been prepared similarly to the procedure as above described, using 1.05 grams of LTA-4A MCR and 20.03 grams of resin.

Glass-to-glass configurations (one for each composition) have been prepared under a moisture protected atmosphere by depositing 0.49 grams of dispensable material onto a surface of (2.54×6.00) cm² followed by UV curing (10 sec, 100 mW/cm2, λ=250-400 nm).

The kinetic penetration levels of H₂O under an exposure condition of the sample at 85° C. and with 85% relative humidity have been evaluated and in table 2 have been reported the relative times to have the same penetration front in the compared samples.

Example 4

0.42 grams of LTA 4A activated through a thermal process at 450° C. under vacuum have been added to a mix of 1.60 grams of Epofix base, 0.07 grams of Epofix hardener (commercial available bicomponent DGEBA epoxy resin) and 0.1 grams of (3-glycidoxypropyl)trimethoxysilane (ABCR). The composition (cold setting epoxy—none) has been thus pre-dispersed by means of simple mechanical stirring and subsequently made homogeneous using a so-called 3 roll mill mixer. All the operations were carried out in glove box.

Similarly, a second composition (cold setting resin—GTO) has been obtained by adding 0.42 grams of GTO (pre-activated through a thermal process at 175° C. under vacuum) to a mix of 1.60 grams of Epofix base, 0.07 grams of Epofix hardener and 0.1 g of ABCR.

Finally a third composition (cold setting resin—POD) has been obtained, with the same procedure, adding, 0.42 grams of (POD pre-activated through a thermal process at 240° C. under vacuum) to a mix of 1.60 grams of Epofix base, 0.07 grams of Epofix hardener and 0.1 grams of ABCR.

In order to achieve the glass to glass configuration for each composition, they were performed in glove depositing the glue over a glass substrate 2.54×6.00×0.015 cm and covered with another glass slide. The resins were cured at 80° C. for 1 hour.

The kinetic penetration levels of H₂O under an exposure condition of the sample at 85° C. and with 85% relative humidity have been evaluated and in table 2 have been reported the relative times to have the same penetration front in the compared samples.

TABLE 1

| Polymer | Nanozeolite functionalization | w/w % | Relative Time to have the same penetration front | Nanozeolite dispersion |
|---|---|---|---|---|
| PMMA | none | 20% | 0.55 | 12% |
| PMMA | POD | 20% | 0.57 | 13% |
| PMMA | OD | 20% | 0.70 | 10% |
| PMMA | MCR | 20% | 1.00 | 10% |

TABLE 2

| Resin | Nanozeolite functionalization | w/w % | Relative Time to have the same penetration front |
|---|---|---|---|
| acrylic | POD | 5% | 0.75 |
| acrylic | MCR | 5% | 1.00 |
| DGEBA-epoxy | none | 20% | 0.81 |
| DGEBA-epoxy | POD | 20% | 1.00 |
| cold-setting epoxy | none | 20% | 0.68 |

TABLE 2-continued

| Resin | Nanozeolite functionalization | w/w % | Relative Time to have the same penetration front |
|---|---|---|---|
| cold-setting epoxy | POD | 20% | 0.95 |
| cold-setting epoxy | GTO | 20% | 1.00 |

The invention claimed is:

1. A sensitive device comprising:
   an edge of the sensitive device;
   a composite material sealing the edge of the sensitive device, the composite material comprising:
      a homogeneous dispersion of superficially functionalized nanozeolites in a polymerizable compound, wherein said nanozeolites contain surface modifying organic groups belonging to the same chemical class of at least one functional group of the polymerizable compound, said composite material capable of being a barrier against H₂O, wherein functionalization on the superficially modified nanozeolites consists of phenyl groups.

2. The sensitive device according to claim 1, wherein the sensitive device is a photovoltaic cell.

3. The sensitive device according to claim 1, wherein the sensitive device is an organic light emitting diode (OLED) screen.

4. The sensitive device according to claim 1, wherein the sensitive device is a micro-electromechanical device.

5. The sensitive device according to claim 1, wherein the sensitive device is an energy storage device.

6. The sensitive device according to claim 5, wherein the sensitive device is a lithium battery.

7. The sensitive device according to claim 1 wherein the surface modifying organic group of the nanozeolites is the same as at least one functional group of the polymerizable compound.

8. The sensitive device according to claim 1, wherein said polymerizable compound is an organic resin, an epoxy resin, or an acrylic resin.

9. The sensitive device according to claim 1, wherein said polymerizable compound is a novolac resin.

10. The sensitive device according to claim 1, wherein said surface modified nanozeolites are one or more of Linde Type A (LTA), Faujasite (FAU), Linde Type L (LTL), Mordentite (MOR), and Gismondine (GIS) zeolites.

11. The sensitive device according to claim 8, wherein the polymerizable compound is a single component resin.

12. The sensitive device according to claim 11, wherein said single component resin is a bisphenol and epichlorohydrin (DGEBA) based resin.

13. A sensitive device comprising:
   an edge of the sensitive device;
   a composite material sealing the edge of the sensitive device, the composite material comprising:
      a homogeneous dispersion of superficially functionalized nanozeolites in a polymerizable compound, wherein said nanozeolites contain surface modifying organic groups belonging to the same chemical class of at least one functional group of the polymerizable compound, said composite material capable of being a barrier against H₂O, wherein functionalization on the superficially modified nanozeolites comprises a pentafluorophenyl group.

* * * * *